(12) United States Patent
Oka et al.

(10) Patent No.: US 7,205,574 B2
(45) Date of Patent: Apr. 17, 2007

(54) OPTICAL SEMICONDUCTOR DEVICE

(75) Inventors: Junji Oka, Osaka (JP); Toshiyuki Ichinose, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 155 days.

(21) Appl. No.: 10/963,622

(22) Filed: Oct. 14, 2004

(65) Prior Publication Data
US 2005/0082560 A1    Apr. 21, 2005

(30) Foreign Application Priority Data

Oct. 16, 2003 (JP) .............................. 2003-356606
Aug. 20, 2004 (JP) .............................. 2004-241114

(51) Int. Cl.
*H01L 27/15* (2006.01)
*H01L 31/12* (2006.01)
*H01L 33/00* (2006.01)

(52) U.S. Cl. ................... 257/81; 257/E25.032; 257/80; 257/82; 257/98; 257/678; 257/680; 174/52.2; 174/52.3; 361/760

(58) Field of Classification Search ........ 257/E25.032, 257/678, 666, 667, 700, 80–82, 98, 432, 257/692, 693, 696, 680, 723, 724; 361/760, 361/764; 174/52.2–52.4
See application file for complete search history.

(56) References Cited

U.S. PATENT DOCUMENTS

| | | | | |
|---|---|---|---|---|
| 5,270,488 A | * | 12/1993 | Ono et al. | 174/350 |
| 5,305,179 A | * | 4/1994 | Sono et al. | 361/718 |
| 5,382,810 A | * | 1/1995 | Isaksson | 257/81 |
| 5,506,445 A | * | 4/1996 | Rosenberg | 257/666 |
| 5,668,383 A | * | 9/1997 | Krieger | 257/80 |
| 6,169,295 B1 | * | 1/2001 | Koo | 257/81 |
| 6,570,188 B1 | * | 5/2003 | Nitsche et al. | 257/81 |
| 6,625,036 B1 | * | 9/2003 | Horio | 361/760 |
| 6,653,564 B2 | * | 11/2003 | Scheidle | 174/527 |

FOREIGN PATENT DOCUMENTS

| | | |
|---|---|---|
| JP | 04-267549 A | 9/1992 |
| JP | 5-90778 A | 4/1993 |
| JP | 6-132424 A | 5/1994 |
| JP | 2000-243890 A | 9/2000 |
| JP | 2001-250899 A | 9/2001 |
| JP | 2002-33444 A | 1/2002 |

* cited by examiner

*Primary Examiner*—Kenneth Parker
*Assistant Examiner*—Chris C. Chu
(74) *Attorney, Agent, or Firm*—Birch, Stewart, Kolasch & Birch, LLP

(57) ABSTRACT

An integral-detem-type optical semiconductor device employing lead frame(s) 11, shield case region(s) 111 created by bending portion(s) of lead frame(s) 11 extending to the exterior being disposed between light-emitting lens portion(s) 19 and light-receiving lens portion(s) 18 of resin package(s) 17 produced as a result of encapsulation by translucent resin(s).

12 Claims, 11 Drawing Sheets

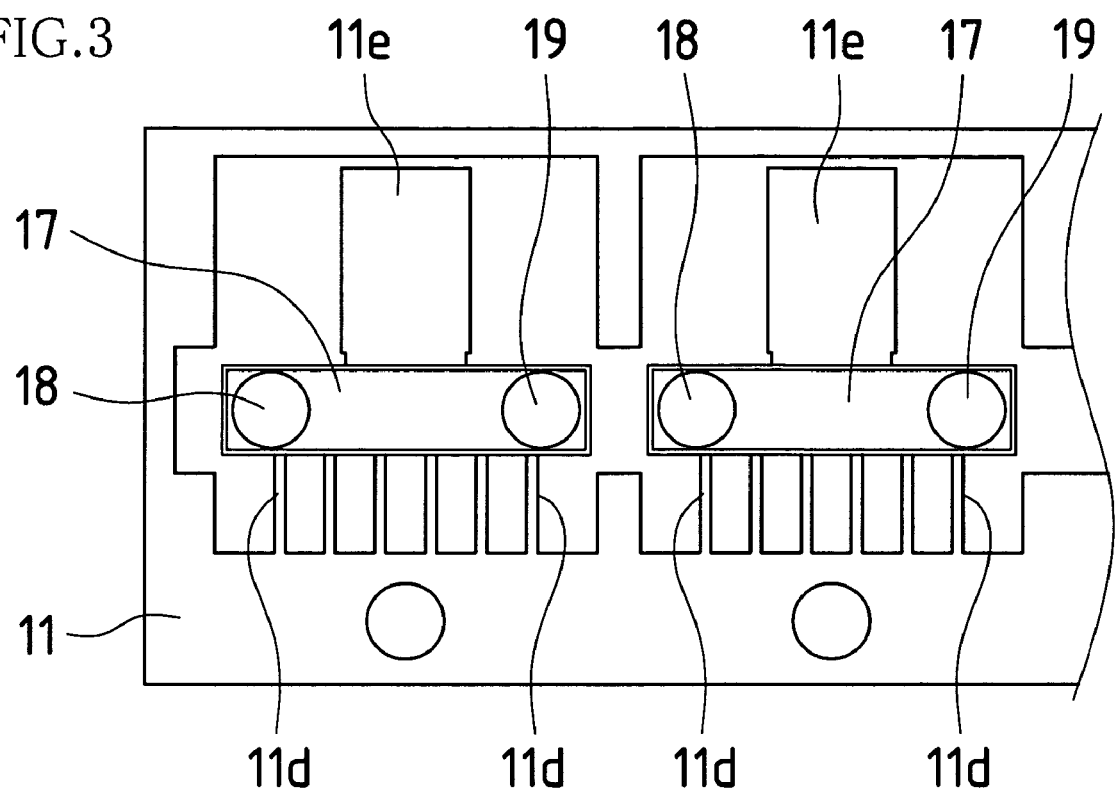

OPTICAL SEMICONDUCTOR DEVICE

BACKGROUND OF INVENTION

This application claims priority under 35 USC 119(a) to Patent Application Nos. 2003-356606 and 2004-241114 filed in Japan on Oct. 16, 2003 and 20 Aug. 2004, respectively, the contents of which are incorporated herein by reference in their entirety.

The present invention relates to an integral-detem-type optical semiconductor device employing lead frame(s).

An exemplary constitution for a conventional integral-detem-type optical semiconductor device employing a lead frame is shown in FIGS. 11 through 14.

In making this optical semiconductor device, light-emitting element 103, light-receiving element 104, and signal processing IC chip 105 are respectively bonded by means of electrically conductive resin (not shown) to component mounting regions 102 of lead frame 101, electrical connection being thereafter made by means of gold wire 106 or the like (see FIG. 11), following which translucent resin is used to encapsulate the entirety so as to produce light-receiving lens portion 108 and light-emitting lens portion 109 at resin package 107 (see FIG. 12). A die, not shown, is thereafter used to cut unwanted portions at tie bar regions (see FIG. 13), terminal regions 110 being produced by means of forming operations; following which, in order to prevent faulty operation of IC chip 105 due to optical or electromagnetic noise, shield case 111 is attached by adhesive, riveting, or the like to resin package 107 (see FIG. 14).

Thus, conventional optical semiconductor devices commonly employ a structure in which shield case 111, a separate member, is attached to resin package 107 in order to prevent faulty operation of the IC chip due to optical or electromagnetic noise (see, e.g., Japanese Patent Application Publication Kokai No. 2002-033444 and Japanese Patent Application Publication Kokai No. H06-132424 (1994).

However, with an optical semiconductor device of the foregoing constitution, there has been the problem that it has been necessary, following creation of resin package 107, to carry out an adhesion operation and/or a riveting operation in order to attach shield case 111, this being a separate member, to resin package 107, complicating operations for manufacture of the optical semiconductor device. Furthermore, during mounting, there has also been the problem that procedures for incorporating the optical semiconductor device into electronic equipment have been made complicated due to the need to ground shield case 111.

SUMMARY OF INVENTION

The present invention was conceived in order to solve such problems, it being an object thereof to provide an optical semiconductor device permitting definitive prevention of faulty operation of IC chip(s) due to optical and/or electromagnetic noise in the context of a comparatively simple structure(s) having small parts count(s).

In order to solve the foregoing and/or other problems, an integral-detem-type optical semiconductor device in accordance with one or more embodiments of the present invention employs one or more lead frames; wherein at least one shield case region created by bending at least a portion of at least one of the lead frame or frames which extends to the exterior is disposed between at least one light-emitting lens portion and at least one light-receiving lens portion of at least one resin package produced as a result of encapsulation by at least one translucent resin.

Because shield plate(s) is/are thus created by bending portion(s) of lead frame(s) extending to the exterior, it is possible to also cause shield case region(s) to be bent when die(s) is/are used to carry out forming operations to produce terminal region(s). This makes it possible to reduce manufacturing man-hours.

In such case, at least one notch may be provided at at least one location at which at least one of the lead frame or frames serving as at least one of the shield case region or regions is bent. Provision of notch(es) facilitates shaping by bending. Furthermore, because shield case region(s) can be made to also serve as heat-dissipating plate(s), it is possible to attain shield case region(s) provided with both heat-dissipating effect as well as IC chip optical-shielding and electromagnetic-shielding effect, and it is possible to achieve miniaturization of resin package(s).

Moreover, if top surface(s) of such bent lead frame(s) is/are made flat, because it will be possible for such surface(s) to serve as surface(s) to which adhesion is made during mounting by reflow soldering, this will facilitate mounting procedure(s) and make it possible to definitively carry out mounting, making it unnecessary to carry out soldering of extending shield case region(s). Similarly, if side surface(s) of such bent lead frame(s) is/are made flat, because it will be possible for such surface(s) to serve as surface(s) to which adhesion is made during mounting by reflow soldering, this will facilitate mounting procedure(s) and make it possible to definitively carry out mounting.

Also, at least one terminal region produced from at least one of the lead frame or frames may be bent so as to be more or less parallel to at least one of the resin package or packages; and at least one recess making way for at least one of the bent terminal region or regions may be created at at least one of the resin package or packages. Provision of such uneven surface(s) permits miniaturization of the overall configuration of the optical semiconductor device. In such case, a plurality of the recesses may be created; a plurality of the terminal regions may be created; and at least one pitch between at least a portion of the recesses may more or less conform to at least one pitch between at least a portion of the terminal regions. That is, resin package(s) may have uneven surface(s) in conformity with pitch(es) between terminal region(s). Such uneven surface(s) permit prevention of deformation of terminal region(s).

Also, at least one opening may be provided at at least one location at which at least one of the lead frame or frames serving as at least one of the shield case region or regions is bent. Provision of opening(s) facilitates shaping by bending.

Also, if at least one distal end portion of at least one of the lead frame or frames serving as at least one of the shield case region or regions is bent, it will be possible to attain satisfactory solderability and it will be possible to prevent damage to board(s) when device(s) is/are mounted.

Furthermore, an integral-detem-type optical semiconductor device in accordance with one or more embodiments of the present invention employs one or more lead frames; wherein at least one light-emitting element, at least one light-receiving element, and at least one signal processing IC chip mounted on at least one of the lead frame or frames are encapsulated by at least one translucent resin; and at least one domain exclusive of at least one terminal region which is exposed amid at least one of the resin-encapsulated region or regions and exclusive of at least one region corresponding to at least one light-receiving lens portion and at least one light-emitting lens portion produced in at least one of the resin-encapsulated region or regions is encapsulated by at least one optically shielding and electrically conductive resin.

By thus employing doubly encapsulated structure(s) making use of optically shielding and electrically conductive resin(s), as compared with shield(s) made up of lead frame(s), improved optical shielding is permitted and improved ability to prevent faulty operation of IC chip(s) is permitted.

Here, if at least one recess making way for at least one terminal region produced by bending of at least one of the lead frame or frames is created at at least one side of at least one resin package produced as a result of encapsulation by at least one of the optically shielding and electrically conductive resin or resins, miniaturization of the overall configuration of the optical semiconductor device will be possible.

Furthermore, at least one recess may be created at at least one location, on at least one surface of at least one resin package produced as a result of encapsulation by at least one of the optically shielding and electrically conductive resin or resins, that would otherwise interfere with at least one terminal region produced by bending of at least one of the lead frame or frames. In such case, a plurality of the recesses may be created; a plurality of the terminal regions may be created; and at least one pitch between at least a portion of the recesses may more or less conform to at least one pitch between at least a portion of the terminal regions. That is, resin package(s) may have uneven surface(s) in conformity with pitch(es) between terminal region(s). Such uneven surface(s) permit prevention of deformation of terminal region(s).

BRIEF DESCRIPTION OF DRAWINGS

FIG. 3 is a plan view showing a stage during the course of manufacture of an optical semiconductor device associated with a first embodiment of the present invention.

FIG. 4(*b*) is a front view of an optical semiconductor device associated with a first embodiment of the present invention. FIG. 4(*c*) is a side view of an optical semiconductor device associated with a first embodiment of the present invention.

FIG. 7(*b*) is a front view of an optical semiconductor device associated with a second embodiment of the present invention. FIG. 7(*c*) is a side view of an optical semiconductor device associated with a second embodiment of the present invention.

FIG. 8(*b*) is a plan view showing a stage subsequent to encapsulation during the course of manufacture of an optical semiconductor device associated with a third embodiment of the present invention. FIG. 8(*c*) is a bottom view showing a stage subsequent to cutting and forming during the course of manufacture of an optical semiconductor device associated with a third embodiment of the present invention.

FIG. 9(*b*) is a front view of an optical semiconductor device associated with a fourth embodiment of the present invention. FIG. 9(*c*) is a side view of an optical semiconductor device associated with a fourth embodiment of the present invention.

FIG. 10(*b*) is a bottom view of an optical semiconductor device associated with a fifth embodiment of the present invention.

FIG. 14(*b*) is a front view of a conventional optical semiconductor device. FIG. 14(*c*) is a side view of a conventional optical semiconductor device.

DESCRIPTION OF PREFERRED EMBODIMENTS

Below, embodiments of the present invention are described with reference to the drawings.

Embodiment 1

Figure 1:
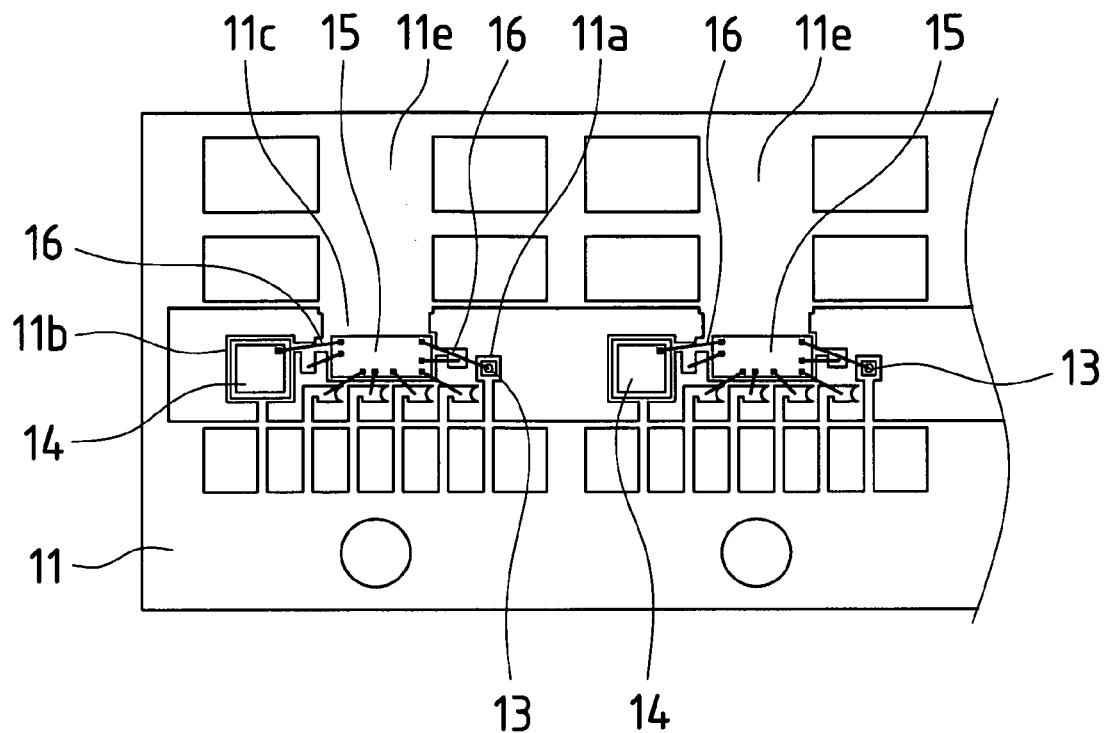
FIG. 1 is a plan view showing a stage during the course of manufacture of an optical semiconductor device associated with a first embodiment of the present invention.
Figure 2:
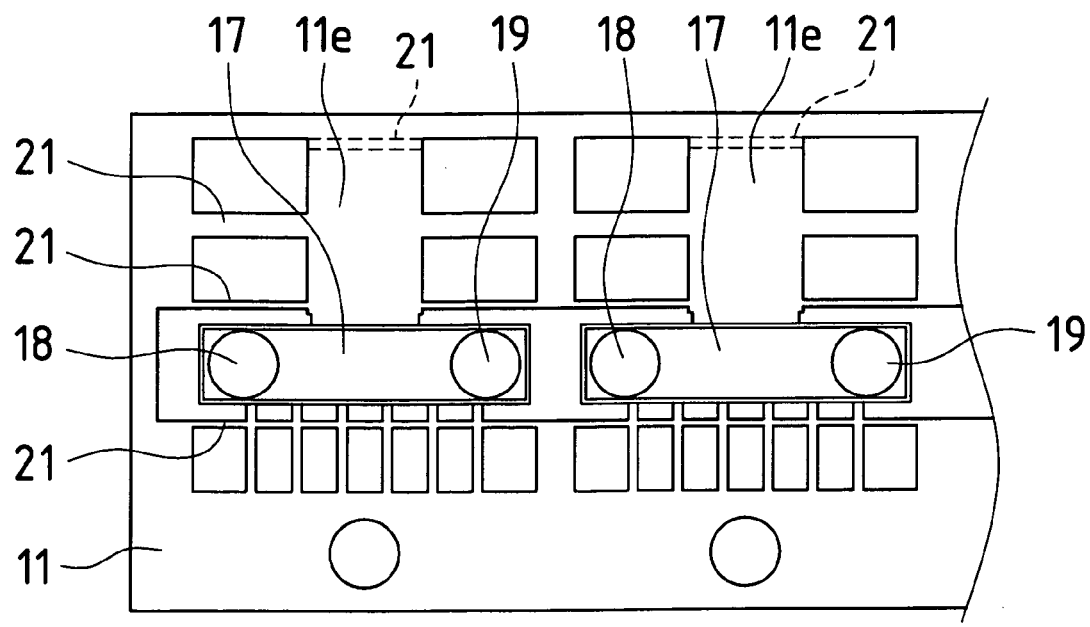
FIG. 2 is a plan view showing a stage during the course of manufacture of an optical semiconductor device associated with a first embodiment of the present invention.
Figure 4A:
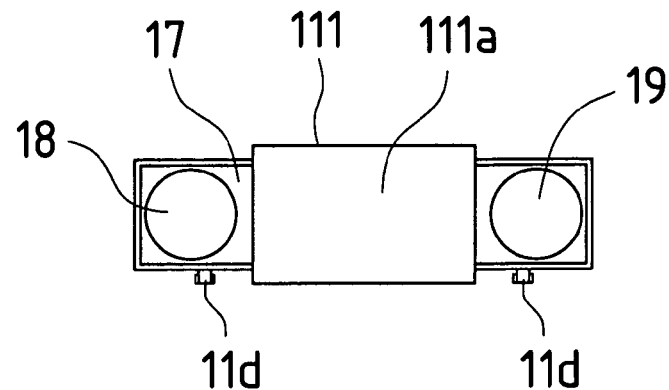
FIG. 4(*a*) is a plan view of an optical semiconductor device associated with a first embodiment of the present invention.
Figure 4B:
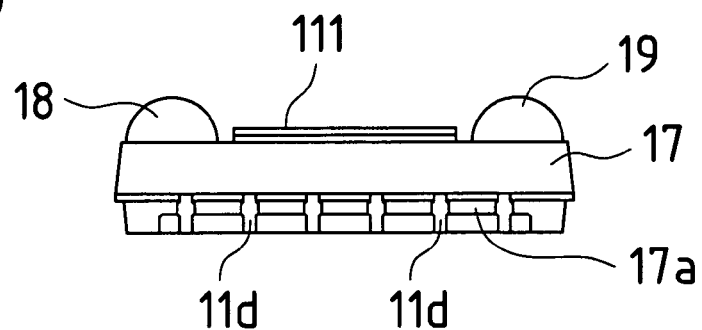
Figure 4C:
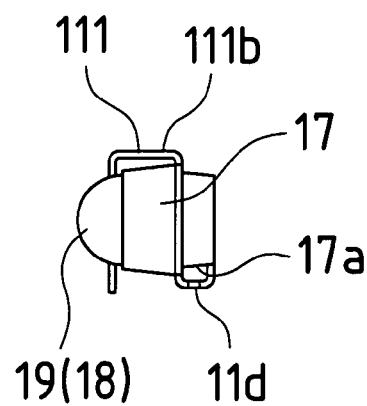

FIGS. 1 through 3 are plan views showing stages during the course of manufacture of an optical semiconductor device associated with the present first embodiment; FIG. 4(*a*) is a plan view of an optical semiconductor device associated with the present first embodiment; FIG. 4(*b*) is a front view of an optical semiconductor device associated with the present first embodiment; and FIG. 4(*c*) is a side view of an optical semiconductor device associated with the present first embodiment.

At the optical semiconductor device of the present first embodiment, lead frame portion(s) 11*e*, serving as shield case region(s) 111, has or have been created in advance in such fashion as to extend from component mounting region(s) 11*c* of lead frame(s) 11, at which signal processing IC chip(s) 15 is/are installed.

Light-emitting element(s) 13, light-receiving element(s) 14, and signal processing IC chip(s) 15 are respectively bonded by means of electrically conductive resin (not shown) to respective component mounting region(s) 11*a*, 11*b*, 11*c* of lead frame(s) 11 having such configuration, electrical connection being thereafter made by means of gold wire 16 or the like (see FIG. 1), following which translucent resin is used to encapsulate the entirety or entireties so as to produce light-receiving lens portion(s) 18 and light-emitting lens portion(s) 19 at resin package(s) 17 (see FIG. 2). Die(s), not shown, is/are thereafter used to cut unwanted portion(s) at tie bar region(s) 21 (see FIG. 3), and die(s) is/are then used to carry out forming operations to produce terminal region(s) 11d and lead frame portion(s) 11e, serving as shield case region(s) 111 (see FIGS. 4(a), (b), and (c)). In such case, in order to facilitate forming operations, notch(es) is/are made at location(s) at which forming operations to produce terminal region(s) 11d and lead frame portion(s) 11e, serving as shield case region(s) 111, of lead frame(s) 11, is/are carried out. Provision of notch(es) facilitates shaping by bending. Furthermore, because shield case region(s) 111 can be made to also serve as heat-dissipating plate(s), miniaturization of resin package(s) 17 is possible.

In such case, if top surface(s) 111a of bent shield case region(s) 111 is/are made flat, because it will be possible for such surface(s) to serve as surface(s) to which adhesion is made during mounting by reflow soldering, this would make it possible to easily and definitively carry out mounting procedure(s). Similarly, if side surface(s) 111b of bent shield case region(s) 111 is/are made flat, because it will be possible for such surface(s) to serve as surface(s) to which adhesion is made during mounting by reflow soldering, this would make it possible to easily and definitively carry out mounting procedure(s).

Furthermore, terminal region(s) 11d produced from lead frame(s) 11 is/are bent downward so as to be more or less parallel to side surface(s) of resin package(s) 17. Here, in the present first embodiment, recess(es) 17a is/are created at side surface(s) of resin package(s) 17 in order to make way for bent terminal region(s) 11d. By thus creating recess(es) 17a, miniaturization of the overall configuration of the optical semiconductor device is made possible, and it is possible to reduce mounting area during mounting by reflow soldering. In such case, while not shown in the drawings, a plurality of recesses 17a, with pitch(es) therebetween chosen to match that or those of terminal region(s) 11d, may be created in similar fashion as at the fifth embodiment, described below. That is, resin package(s) 17 may have uneven surface(s) in conformity with pitch(es) between terminal region(s) 11d. Such uneven surface(s) permit prevention of deformation of terminal region(s) 11d.

Furthermore, by causing shield case region(s) 111 between light-emitting portion(s) and light-receiving portion(s) to be somewhat longer than bent terminal region(s) 11d, it is possible to alleviate instability caused by tapered portion(s) of resin package(s) 17 during mounting by reflow soldering. That is, this is so because when bent terminal region(s) 11d is/are mounted to circuit board(s) coated with solder paste, mounting proceeds more stably when terminal region(s) 11d is/are made shorter by amount(s) corresponding to thickness(es) thereof. This presupposes that shield case region(s) 111 (GND) between light-emitting portion(s) and light-receiving portion(s), and one terminal (GND) or set of terminals (GND) among terminal region(s) 11d, are connected at point(s) within device(s), and that shield case region(s) 111 is/are not soldered.

Embodiment 2

Figure 5:
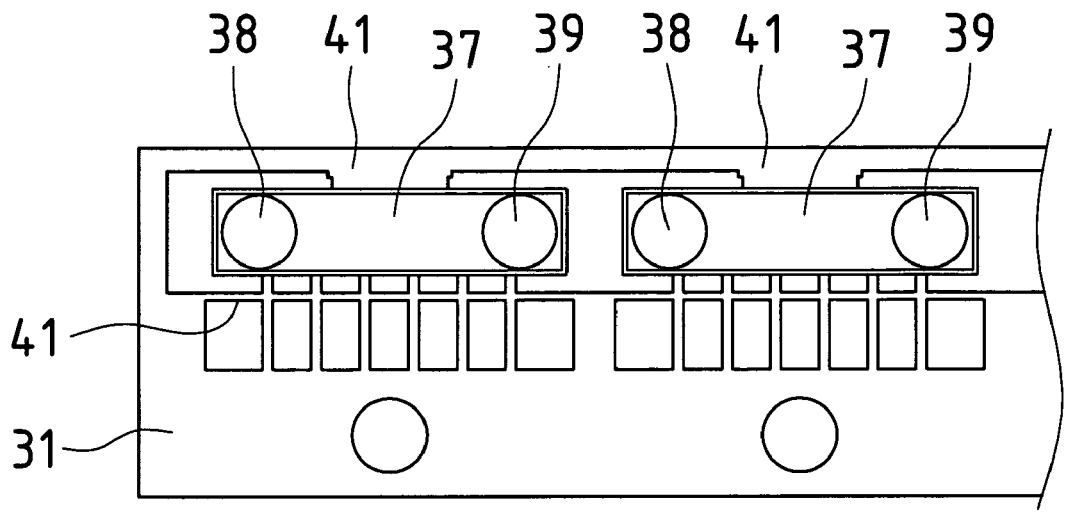
FIG. 5 is a plan view showing a stage during the course of manufacture of an optical semiconductor device associated with a second embodiment of the present invention.
Figure 6:
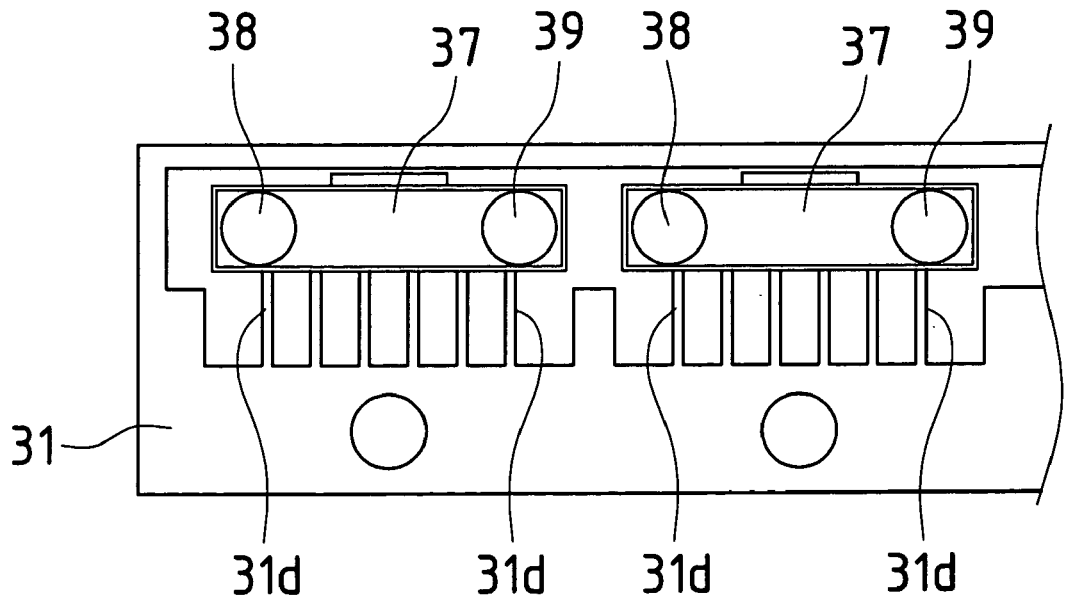
FIG. 6 is a plan view showing a stage during the course of manufacture of an optical semiconductor device associated with a second embodiment of the present invention.
Figure 7A:
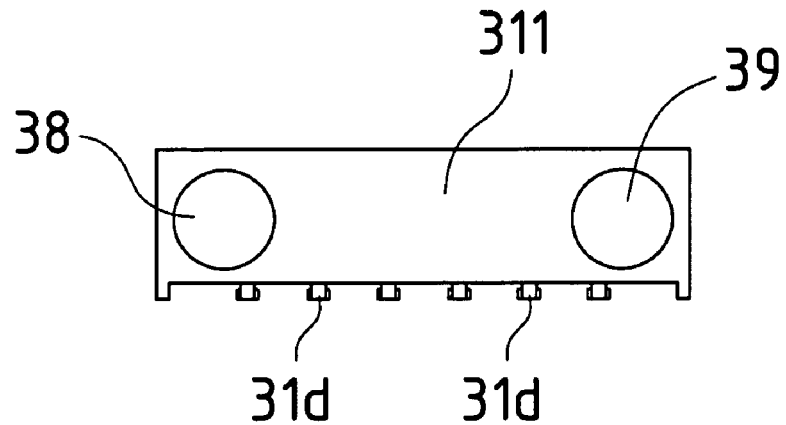
FIG. 7(*a*) is a plan view of an optical semiconductor device associated with a second embodiment of the present invention.
Figure 7B:
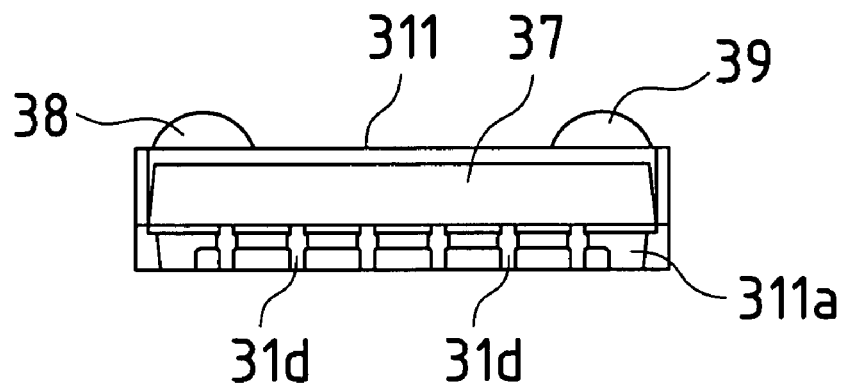
Figure 7C:
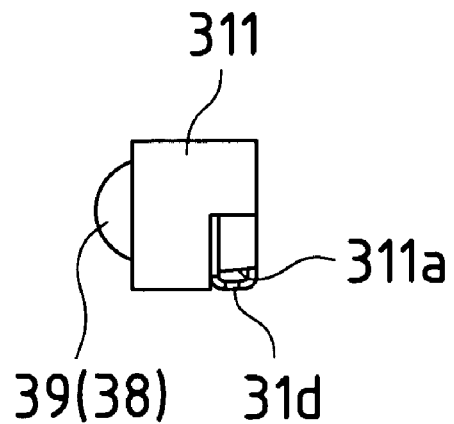

FIGS. 5 and 6 are plan views showing stages during the course of manufacture of an optical semiconductor device associated with the present second embodiment; FIG. 7(a) is a plan view of an optical semiconductor device associated with the present second embodiment; FIG. 7(b) is a front view of an optical semiconductor device associated with the present second embodiment; and FIG. 7(c) is a side view of an optical semiconductor device associated with the present second embodiment.

In making the optical semiconductor device of the present second embodiment, light-emitting element(s), light-receiving element(s), and signal processing IC chip(s) are respectively bonded by means of electrically conductive resin to respective component mounting region(s) of lead frame(s) 31, electrical connection being thereafter made by means of gold wire or the like (the constitution up to this point being similar to that shown in FIG. 1), following which translucent resin is used to encapsulate the entirety or entireties so as to produce light-receiving lens portion(s) 38 and light-emitting lens portion(s) 39 at resin package(s) 37 (see FIG. 5). Die(s), not shown, is/are then used to cut unwanted portion(s) at tie bar region(s) 41 (see FIG. 6). Resin which is optically shielding and electrically conductive is thereafter employed to carry out secondary encapsulation of domain(s) exclusive of region(s) corresponding to light-receiving lens portion(s) 38 and light-emitting lens portion(s) 39 produced at resin package(s) 37 and exclusive of terminal region(s) 31d exposed at resin package(s) 37 so as to produce shield case region(s) 311; and die(s) is/are used to carry out forming operations to produce terminal region(s) 31d (see FIGS. 7(a), (b), and (c)).

Here, in the present second embodiment, recess(es) 311a is/are created at side surface(s) of shield case region(s) 311 in order to make way for bent terminal region(s) 31d. By thus creating recess(es) 311a, miniaturization of the overall configuration of the optical semiconductor device is made possible, and it is possible to reduce mounting area during mounting by reflow soldering.

As compared with shield case region(s) 111 made up of lead frame(s) 11 as at the foregoing first embodiment, the present second embodiment permits improved optical shielding and permits improved ability to prevent faulty operation of IC chip(s).

Embodiment 3

Figure 8A:
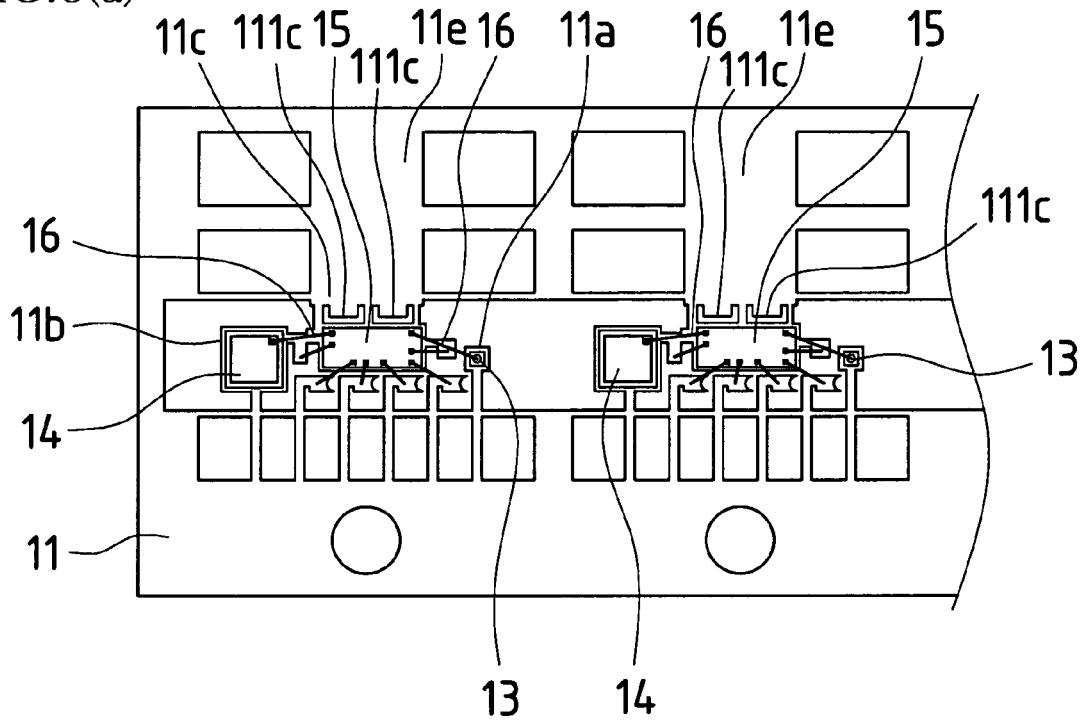
FIG. 8(*a*) is a plan view showing a stage prior to encapsulation during the course of manufacture of an optical semiconductor device associated with a third embodiment of the present invention.
Figure 8B:
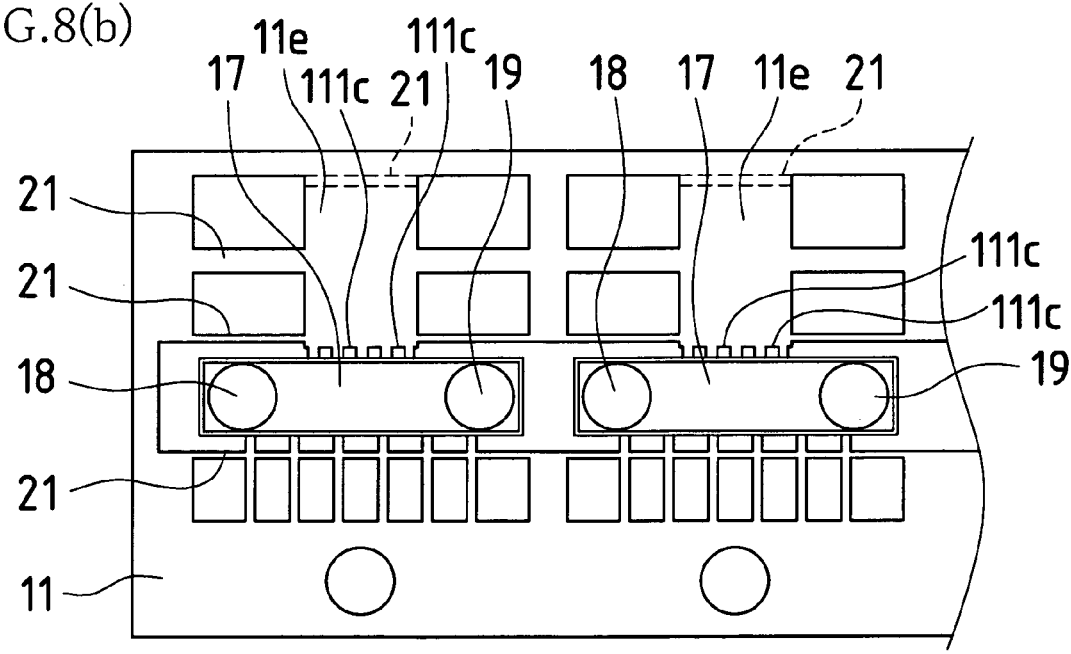
Figure 8C:
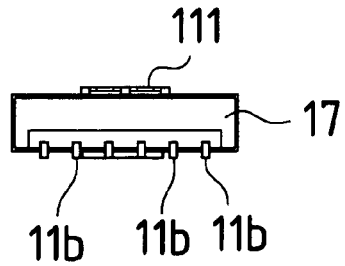

FIG. 8(a) is a plan view showing a stage prior to encapsulation during the course of manufacture of an optical semiconductor device associated with the present third embodiment; FIG. 8(b) is a plan view showing a stage subsequent to encapsulation during the course of manufacture of an optical semiconductor device associated with the present third embodiment; and FIG. 8(c) is a bottom view showing a stage subsequent to cutting and forming during the course of manufacture of an optical semiconductor device associated with the present third embodiment.

It is necessary that configuration(s) of shield case region(s) 111 of the present invention be of such dimension(s) as will permit it or they to cover IC chip(s) 15 within resin package(s) 17. In the present case, such dimension(s) being on the order of 2 mm, there is concern that when such portion(s) is/are bent, stress(es) acting at bent region(s) of shield case region(s) 111 will cause occurrence of cracking and/or the like. In the present third embodiment, in order to relieve such stress(es) acting on shield case region(s) 111, two horizontally long openings 111c which are more or less parallel to direction(s) of bending are provided at bent region(s) of shield case region(s) 111. Note, however, that neither the shape nor the number of opening(s) 111c is limited hereto. Because carrying out bending at such opening(s) 111c facilitates bending of shield case region(s) 111, it is possible to mitigate damage to shield case region(s) 111.

Embodiment 4

Figure 9A:
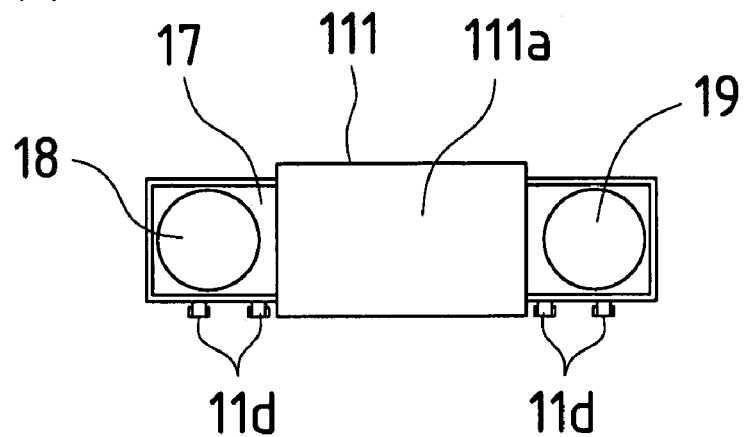
FIG. 9(*a*) is a plan view of an optical semiconductor device associated with a fourth embodiment of the present invention.
Figure 9B:
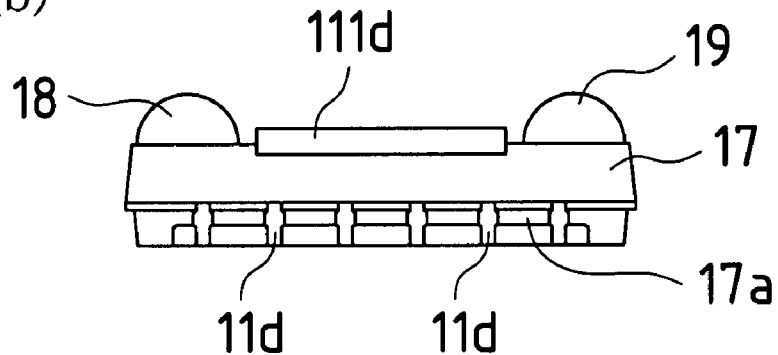
Figure 9C:
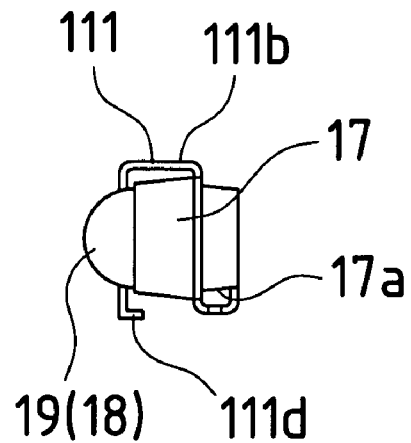

FIG. 9(a) is a plan view of an optical semiconductor device associated with the present fourth embodiment; FIG. 9(b) is a front view of an optical semiconductor device associated with the present fourth embodiment; and FIG. 9(c) is a side view of an optical semiconductor device associated with the present fourth embodiment.

Configuration(s) of shield case region(s) 111 in accordance with the present fourth embodiment is/are similar to configuration(s) of shield case region(s) 111 in accordance with the first embodiment shown in FIG. 4, except that location(s) of shield case region(s) 111 at which soldering is carried out, i.e., distal end portion(s) 111d of shield case region(s) 111, is/are bent. This permits increase in solder joint area, improving solder joint strength and improving reliability of soldered location(s). Furthermore, bending of distal end portion(s) 111d is also effective in preventing damage to board(s) due to load(s) acting thereon when mounter(s), not shown, is/are employed during mounting.

Embodiment 5

Figure 10A:
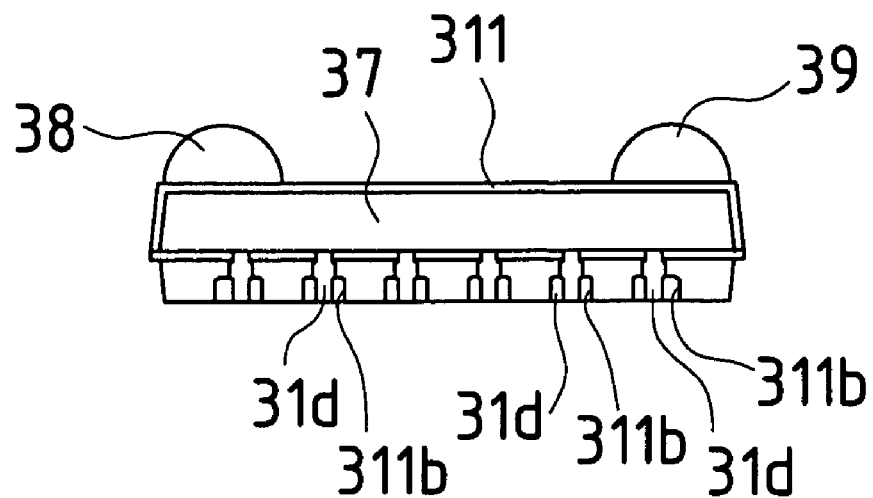
FIG. 10(*a*) is a front view of an optical semiconductor device associated with a fifth embodiment of the present invention.
Figure 10B:
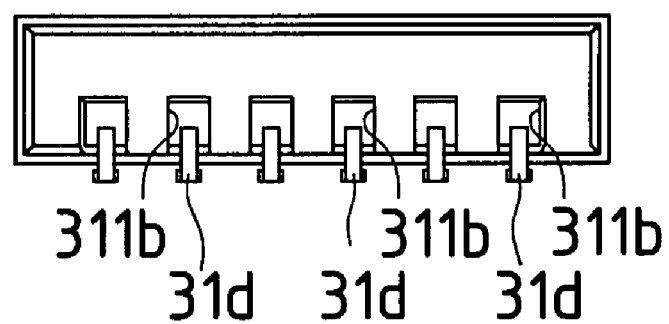
Figure 11:
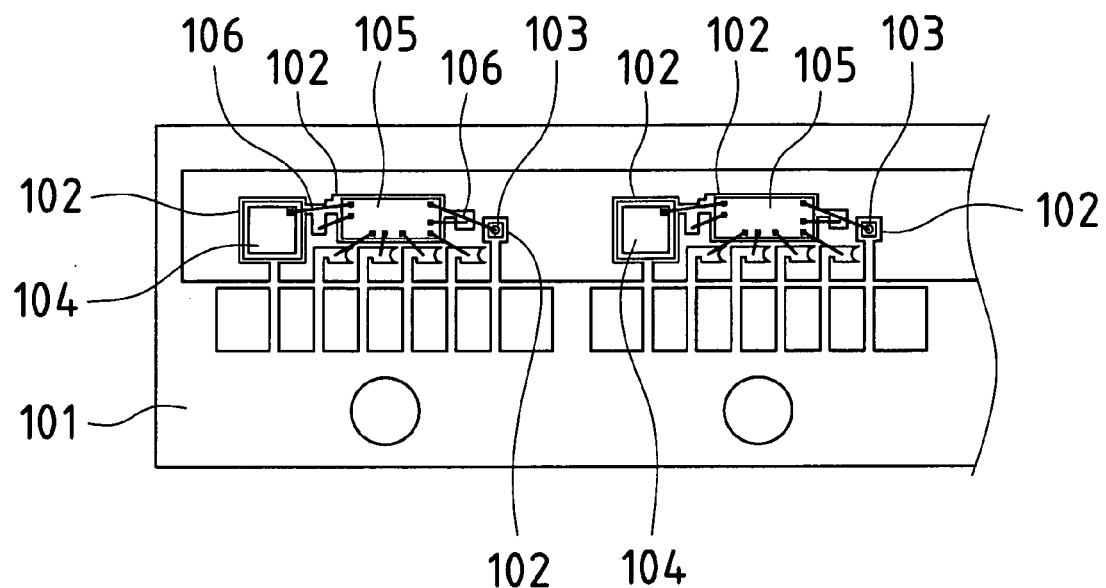
FIG. 11 is a plan view showing a stage during the course of manufacture of a conventional optical semiconductor device.
Figure 12:
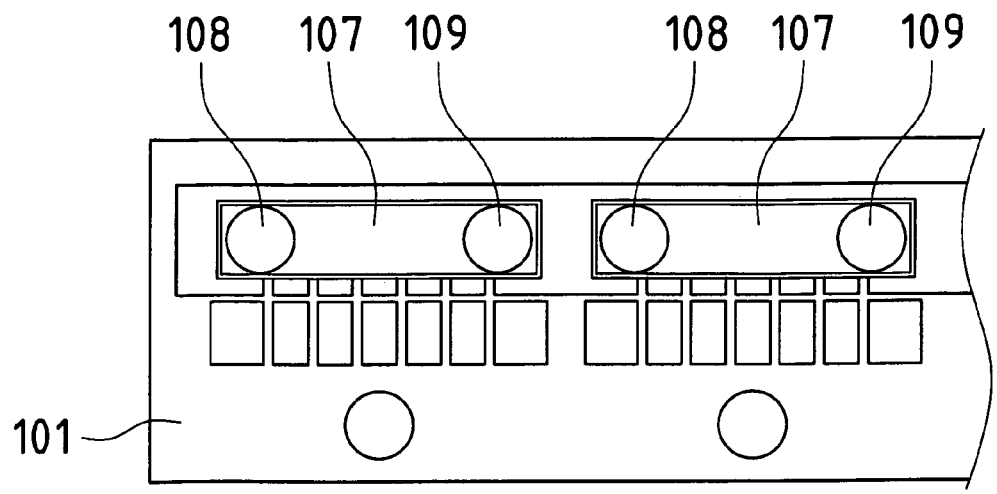
FIG. 12 is a plan view showing a stage during the course of manufacture of a conventional optical semiconductor device.
Figure 13:
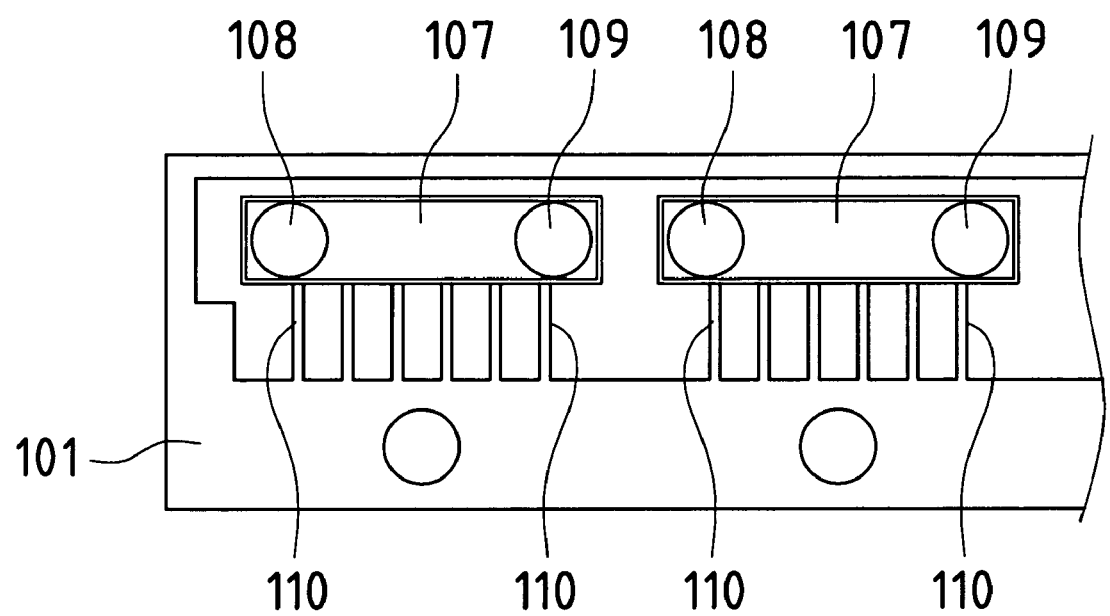
FIG. 13 is a plan view showing a stage during the course of manufacture of a conventional optical semiconductor device.
Figure 14A:
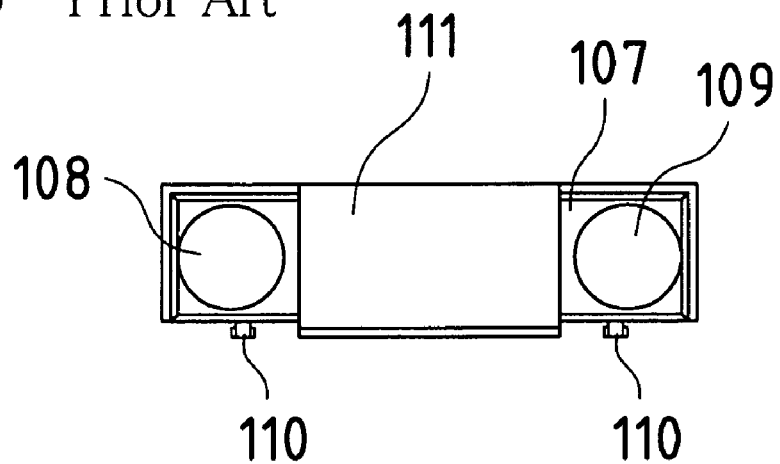
FIG. 14(*a*) is a plan view of a conventional optical semiconductor device.
Figure 14B:
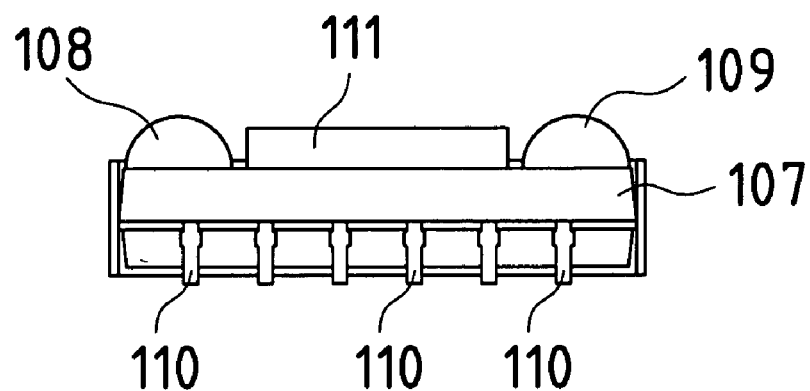
Figure 14C:
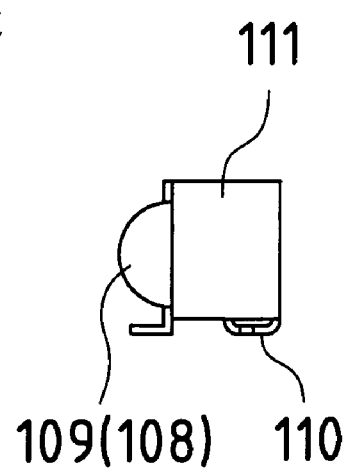

FIG. 10(a) is a plan view of an optical semiconductor device associated with the present fifth embodiment; FIG. 10(b) is a bottom view of an optical semiconductor device associated with the present fifth embodiment.

The present fifth embodiment is a variation on the foregoing second embodiment. That is, light-emitting element(s), light-receiving element(s), and signal processing IC chip(s) are respectively bonded by means of electrically conductive resin to respective component mounting region(s) of lead frame(s) 31, electrical connection being thereafter made by means of gold wire or the like (the constitution up to this point being similar to that shown in FIG. 1), following which translucent resin is used to encapsulate the entirety or entireties so as to produce light-receiving lens portion(s) 38 and light-emitting lens portion(s) 39 at resin package(s) 37 (see FIG. 5). Die(s), not shown, is/are then used to cut unwanted portion(s) at tie bar region(s) 41 (see FIG. 6). Resin which is optically shielding and electrically conductive is thereafter employed to carry out secondary encapsulation of domain(s) exclusive of region(s) corresponding to light-receiving lens portion(s) 38 and light-emitting lens portion(s) 39 produced at resin package(s) 37 and exclusive of terminal region(s) 31d exposed at resin package(s) 37 so as to produce shield case region(s) 311; and die(s) is/are used to carry out forming operations to produce terminal region(s) 31d (see FIGS. 10(a) and (b)).

Here, in the present fifth embodiment, recess(es) 311b is/are created at location(s) on surface(s) of shield case region(s) 311 that would otherwise interfere with terminal region(s) 31d produced by bending of lead frame(s) 31. A plurality of such recess(es) 311b are created with pitch(es) therebetween chosen to match that or those of terminal region(s) 31d. That is, shield case region(s) 311 has or have uneven surface(s) in conformity with pitch(es) between terminal region(s) 31d. Such uneven surface(s) permit prevention of deformation of terminal region(s) 31d. That is, such uneven feature(s) serve as guide(s) during bending of terminal region(s) 31d and act to prevent improper pitch between terminal region(s) 31d as well as occurrence of deformation of terminal region(s) 31d.

Moreover, the present invention may be embodied in a wide variety of forms other than those presented herein without departing from the spirit or essential characteristics thereof. The foregoing embodiments, therefore, are in all respects merely illustrative and are not to be construed in limiting fashion. The scope of the present invention being as indicated by the claims, it is not to be constrained in any way whatsoever by the body of the specification. All modifications and changes within the range of equivalents of the claims are moreover within the scope of the present invention.

What is claimed is:

1. An optical semiconductor device which receives and emits light employing one or more lead frames;
   wherein at least one shield case, created by bending at least a portion of at least one lead frame which extends to the exterior, is disposed between at least one light-emitting lens portion and at least one light-receiving lens portion of at least one resin package produced as a result of encapsulation of said semiconductor device by at least one translucent resin.

2. The optical semiconductor device according to claim 1 wherein at least one notch is provided at at least one location at which said at least one lead frame serving as said at least one shield case is bent.

3. The optical semiconductor device according to claim 1 wherein said at least one shield case also serves as a heat-dissipating plate.

4. The optical semiconductor device according to claim 1 wherein at least one top surface of the bent said at least one lead frame is flat so as to permit said at least one top surface to serve as at least one surface to which adhesion is made during mounting.

5. The optical semiconductor device according to claim 1 wherein at least one side surface of the bent said at least one lead frame is flat so as to permit said at least one side surface to serve as at least one surface to which adhesion is made during mounting.

6. The optical semiconductor device according to claim 1 wherein
   at least one terminal produced from one of the same and a different said at least one lead frame is bent so as to be more or less parallel to said at least one resin package; and
   at least one recess making way for said at least one bent terminal is created at said at least one resin package.

7. The optical semiconductor device according to claim 1 wherein at least one opening for facilitating bending is provided at at least one location at which said at least one lead frame serving as said at least one shield case is bent.

8. The optical semiconductor device according to claim 1 wherein at least one distal end portion of said at least one lead frame serving as said at least one shield case is bent.

9. An integral-detm-type optical semiconductor device employing one or more lead frames;
   wherein at least one light-emitting element, at least one light-receiving element, and at least one signal processing IC chip mounted on at least one lead frame are encapsulated by at least one translucent resin; and
   at least one domain, exclusive of at least one terminal which is exposed amid at least one resin-encapsulated region and exclusive of at least one region corresponding to at least one light-receiving lens portion and at least one light-emitting lens portion produced in said at least one resin-encapsulated region, is further encapsulated by at least one optically shielding and electrically conductive secondary encapsulation resin.

10. The optical semiconductor device according to claim 9 wherein at least one recess making way for at least one terminal produced by bending of at least one lead frame is created at at least one side of at least one resin package produced as a result of encapsulation by said at least one optically shielding and electrically conductive secondary encapsulation resin.

11. The optical semiconductor device according to claim 9 wherein at least one recess is created at at least one location, on at least one surface of at least one resin package produced as a result of encapsulation by said at least one optically shielding and electrically conductive secondary encapsulation resin, that would otherwise interfere with at least one terminal produced by bending of at least one lead frame.

12. The optical semiconductor device according to claim 6 or 11 wherein
  a plurality of the recesses are created;
  a plurality of terminals are created; and
  at least one pitch between at least a portion of the plurality of recesses more or less conforms to at least one pitch between at least a portion of the plurality of terminals.

* * * * *